United States Patent
Zhang et al.

(10) Patent No.: US 8,755,106 B2
(45) Date of Patent: Jun. 17, 2014

(54) MICROELECTROMECHANICAL SYSTEM (MEMS) DEVICE, METHOD OF OPERATING THE SAME, AND METHOD OF FORMING THE SAME

(75) Inventors: Qingxin Zhang, Singapore (SG); Yu Du, Singapore (SG); Chee Wei Tan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 217 days.

(21) Appl. No.: 13/377,030

(22) PCT Filed: Jun. 11, 2009

(86) PCT No.: PCT/SG2009/000210
§ 371 (c)(1),
(2), (4) Date: Mar. 29, 2012

(87) PCT Pub. No.: WO2010/144051
PCT Pub. Date: Dec. 16, 2010

(65) Prior Publication Data
US 2012/0182594 A1    Jul. 19, 2012

(51) Int. Cl.
*G02B 26/00* (2006.01)
*H01H 71/00* (2006.01)
*H01H 61/00* (2006.01)
*H01H 51/00* (2006.01)

(52) U.S. Cl.
USPC .............................. 359/290; 335/144; 337/14

(58) Field of Classification Search
USPC .............. 359/290–292, 298; 337/2, 3, 14, 53; 335/77, 78, 80, 141, 144
See application file for complete search history.

(56) References Cited

U.S. PATENT DOCUMENTS 6,367,251 B1    4/2002    Wood
7,240,420 B1    7/2007    Ellis et al.
(Continued)

FOREIGN PATENT DOCUMENTS

EP          1582499 A2    10/2005
WO     WO2004011985     2/2004

OTHER PUBLICATIONS

Alignment and Fixing of Fiber Optics Based on Electrothermal MEMS Actuators, A. Unamuno, J. Yao, and D. Uttamchandani, Senior Member, IEEE.
(Continued)

*Primary Examiner* — Thomas K Pham
*Assistant Examiner* — Brandi Thomas
(74) *Attorney, Agent, or Firm* — K. David Crockett, Esq.; Niky Economy Syrengelas, Esq.; Crockett & Crockett, PC

(57) ABSTRACT

A microelectromechanical system (MEMS) device, method of operating the MEMS device, and a method of forming the MEMS device are provided. The MEMS device includes a positioning mechanism and a locking mechanism. The positioning mechanism includes a first arm structure having a first surface and a second surface; a second arm structure having a first surface and a second surface; wherein the first surface of the first arm structure faces the first surface of the second arm structure. The positioning mechanism also includes a first actuator disposed adjacent to the second surface of the first arm structure facing away from the second arm structure; and a second actuator disposed adjacent to the second surface of the second arm structure facing away from the first arm structure. The locking mechanism includes a first pair of locking elements arranged such that each locking element is disposed at two opposite side surfaces of the first arm structure between the first and second surfaces of the first arm structure; and a second pair of locking elements arranged such that each locking element is disposed at two opposite side surfaces of the second arm structure between the first and second surfaces of the second arm structure. The first and second pairs of locking elements are configured to engage with and disengage from the first and second arm structures respectively.

18 Claims, 20 Drawing Sheets

(56) References Cited

U.S. PATENT DOCUMENTS

| | | |
|---|---|---|
| 7,398,734 B1 | 7/2008 | Jean |
| 7,552,681 B1 | 6/2009 | Laib et al. |
| 7,944,332 B2 * | 5/2011 | Hilgers ............................ 335/78 |
| 8,497,751 B2 * | 7/2013 | Ziaei et al. ....................... 335/78 |
| 2002/0172452 A1 | 11/2002 | Zhang et al. |
| 2006/0221430 A1 | 10/2006 | Zhu et al. |
| 2007/0065978 A1 | 3/2007 | Rhee et al. |

OTHER PUBLICATIONS

Bent-Beam Electrothermal Actuators—Part II: Linear and Rotary Microengines, Jae-Sung Park, Larry L. Chu, Andrew D. Oliver, and Yogesh B. Gianchandani, Member, IEEE.

Two-Dimensional Fiber Positioning and Clamping Device for Product-Internal Microassembly, Vincent A. Henneken, Wouter P. Sassen, Wim van der Vlist, Wim H. A. Wien, Marcel Tichem, and Pasqualina M. Sarro, Fellow, IEEE.

Multistate Latching MEMS Variable Optical Attenuator, R. R. A. Syms, H. Zou, J. Stagg, and D. F. Moore.

Robust latching MEMS translation stages for micro-optical systems, R R A Syms, H Zou and J Stagg.

Design of a bidirectional MEMS actuator with high displacement resolution, large driving force and power-free latching, Weisong Wang, Svetlana Tatic-Lucic, Walter L Brown, Richard Vinci.

Precision in-package positioning with a thermal inchworm, Weisong Wang, Svetlana Tatic-Lucic, Walter Brown, Jason Iceman, Seungmin Hyun, Richard Vinci.

Koester et al., "MUMPs Design Handbook".

* cited by examiner

MICROELECTROMECHANICAL SYSTEM (MEMS) DEVICE, METHOD OF OPERATING THE SAME, AND METHOD OF FORMING THE SAME

TECHNICAL FIELD

Various embodiments relate generally to a microelectromechanical system (MEMS) device, a method of operating the MEMS device, and a method of forming the MEMS device.

BACKGROUND

With a requirement of a smaller footprint for semiconductor and photoelectronics packages, microelectromechanical system (MEMS) technology has emerged. A higher precision of positioning small components is thus required. Actuation mechanisms have been used in the MEMS technology for positioning components. However, there is a problem of locking the components in position.

Conventionally, the components were fixed in a position by ultraviolet curing of an epoxy adhesive. However, the positions of the components may shift after curing of the epoxy adhesive due to stress inside the solid epoxy. Such problems also exist in cases where thermoplastic material was used as glue to hold the components in place.

Passive locks and rack-and-tooth mechanisms were also used to keep the components in position. However, a precise alignment is required by the passive locks and the rack-and-tooth mechanisms to perform the locking functionality.

SUMMARY

In an embodiment, there is provided a microelectromechanical system (MEMS) device including a positioning mechanism and a locking mechanism. The positioning mechanism includes a first arm structure having a first surface and a second surface; a second arm structure having a first surface and a second surface; wherein the first surface of the first arm structure faces the first surface of the second arm structure. The positioning mechanism also includes a first actuator disposed adjacent to the second surface of the first arm structure facing away from the second arm structure; and a second actuator disposed adjacent to the second surface of the second arm structure facing away from the first arm structure. The locking mechanism includes a first pair of locking elements arranged such that each locking element is disposed at two opposite side surfaces of the first arm structure between the first and second surfaces of the first arm structure; and a second pair of locking elements arranged such that each locking element is disposed at two opposite side surfaces of the second arm structure between the first and second surfaces of the second arm structure. The first and second pairs of locking elements are configured to engage with and disengage from the first and second arm structures respectively.

In another embodiment, there is provided a method of operating a microelectromechanical system (MEMS) device, including disengaging a first pair of locking elements from a first arm structure and disengaging a second pair of locking elements from a second arm structure; moving the first and second arm structures; and locking final positions of the first and second arm structures.

In another embodiment, there is provided method of forming a microelectromechanical system (MEMS) device, including depositing a first layer of oxide above a first surface of a silicon wafer; depositing a second layer of oxide above a second surface of the silicon wafer; depositing a layer of polysilicon above the first layer of oxide; and doping and patterning the layer of polysilicon to expose the first layer of oxide.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a microelectromechanical system (MEMS) device, a method of operating the MEMS device, and a method of forming the MEMS device will be described in detail below with reference to the accompanying figures. It will be appreciated that the embodiments described below can be modified in various aspects without changing the essence of the invention.

Figure 1:
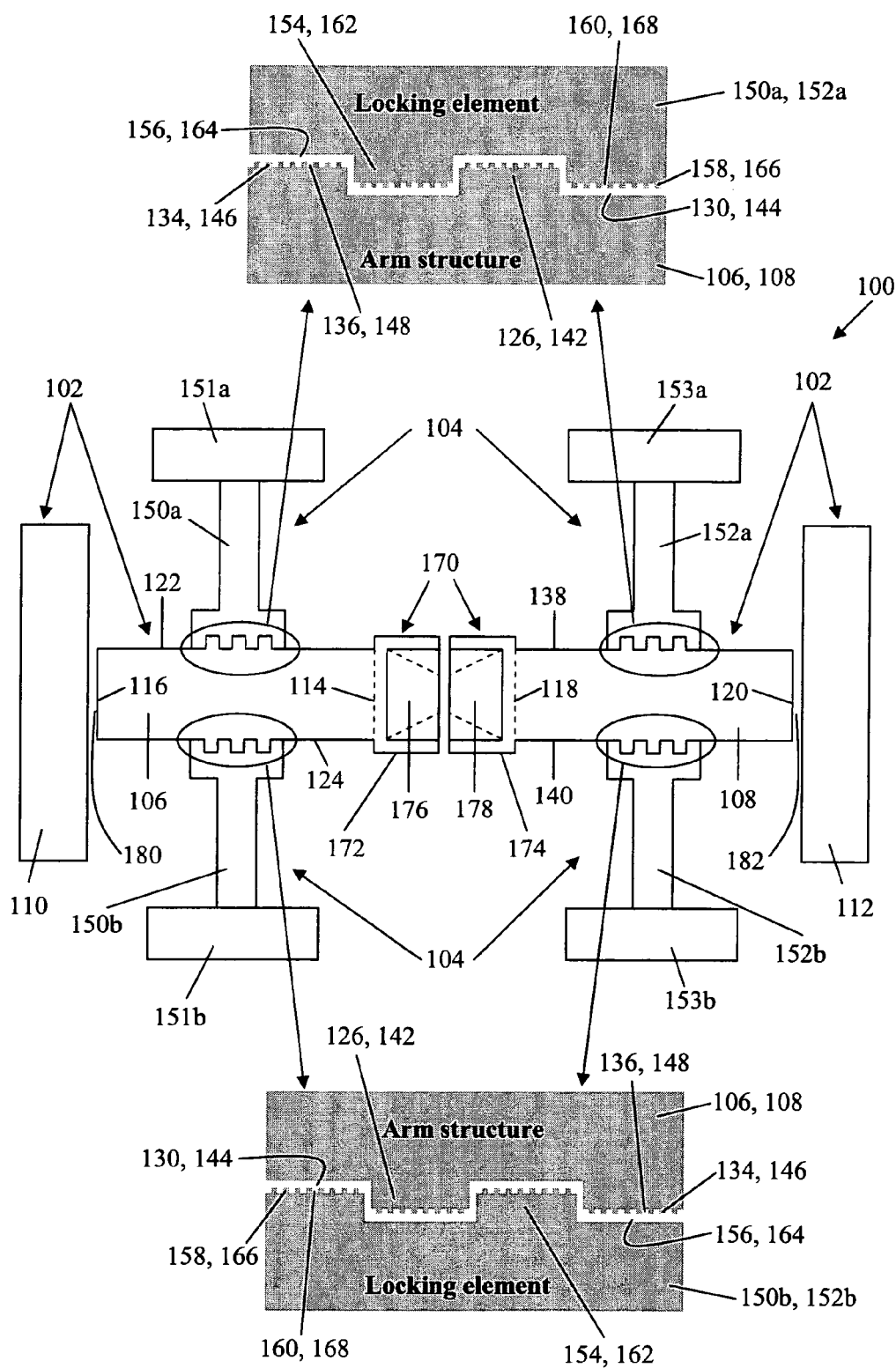
FIG. 1 shows a schematic diagram of a plan view of a microelectromechanical system (MEMS) device.

FIG. 1 shows a schematic diagram of a plan view of a microelectromechanical system (MEMS) device 100. The MEMS device 100 may include a positioning mechanism 102 and a locking mechanism 104. The positioning mechanism 102 may include a first arm structure 106, a second arm structure 108, a first actuator 110 and a second actuator 112. The first arm structure 106 may have a first surface 114 and a second surface 116. The second arm structure 108 may have a first surface 118 and a second surface 120. The first surface 114 of the first arm structure 106 may face the first surface 118 of the second arm structure 108. The first actuator 110 may be disposed adjacent to the second surface 116 of the first arm structure 106. The second actuator 112 may be disposed adjacent to the second surface 120 of the second arm structure 108. The first actuator 110 and the second actuator 112 may be thermal actuators.

Further, the first arm structure 106 may have two opposite side surfaces 122, 124 between the first surface 114 and the second surface 116 of the first arm structure 106. The first arm structure 106 may have a plurality of protruding portions 126 disposed along a portion or a whole of the two side surfaces 122, 124 of the first arm structure 106. Each protruding portion 126 of the first arm structure 106 may be spaced apart from an adjacent protruding portion 126 by a cavity 130. Each protruding portion 126 of the first arm structure 106 may have a plurality of tooth structures 134. Each tooth structure 134 may be spaced apart from an adjacent tooth structure 134 by a cavity 136.

The second arm structure 108 may have two opposite side surfaces 138, 140 between the first surface 118 and the second surface 120 of the second arm structure 108. The second arm structure 108 may have a plurality of protruding portions 142 disposed along a portion or a whole of the two side surfaces 138, 140 of the second arm structure 108. Each protruding portion 142 of the second arm structure 108 may be spaced apart from an adjacent protruding portion 142 by a cavity 144. Each protruding portion 142 of the second arm structure 108 may have a plurality of tooth structures 146. Each tooth structure 146 may be spaced apart from an adjacent tooth structure 146 by a cavity 148.

The locking mechanism 104 of the MEMS device 100 may include a first pair of locking elements 150a, 150b and a second pair of locking elements 152a, 152b. The first pair of locking elements 150a, 150b may be arranged such that each locking element 150a, 150b is disposed at two opposite side surfaces 122, 124 of the first arm structure 106. That is, the locking element 150a may be disposed at the side surface 122 of the first arm structure 106 and the locking element 150b may be disposed at the side surface 124 of the first arm structure 106 opposite to the side surface 122. Each locking element 150a, 150b may have a respective actuator 151a, 151b configured to move the corresponding locking element 150a, 150b. The actuators 151a, 151b may be thermal actuators.

The second pair of locking elements 152a, 152b may be arranged such that each locking element 152a, 152b is disposed at two opposite surfaces 138, 140 of the second arm structure 108. That is, the locking element 152a may be disposed at the side surface 138 of the second arm structure 108 and the locking element 152b may be disposed at the side surface 140 of the second arm structure 108 opposite to the side surface 138. Each locking element 152a, 152b may have a respective actuator 153a, 153b configured to move the corresponding locking element 152a, 152b. The actuators 153a, 153b may be thermal actuators.

In addition, the first pair of locking elements 150a, 150b may have a plurality of protruding portions 154. Each protruding portion 154 of the first pair of locking elements 150a, 150b may be spaced apart from an adjacent protruding portion 154 by a cavity 156. Each protruding portion 154 of the first pair of locking elements 150a, 150b may have a plurality of tooth structures 158. Each tooth structure 158 may be spaced apart from an adjacent tooth structure 158 by a cavity 160.

The second pair of locking elements 152a, 152b may also have a plurality of protruding portions 162. Each protruding portion 162 of the second pair of locking elements 152a, 152b may be spaced apart from an adjacent protruding portion 162 by a cavity 164. Each protruding portion 162 of the second pair of locking elements 152a, 152b may have a plurality of tooth structures 166. Each tooth structure 166 may be spaced apart from an adjacent tooth structure 166 by a cavity 168.

In addition, the MEMS device 100 may have a holding mechanism 170. The holding mechanism 170 may have a first wedge structure 172 disposed at the first surface 114 of the first arm structure 106 and a second wedge structure 174 disposed at the first surface 118 of the second arm structure 108. A sloping surface 176 of the first wedge structure 172 may face a sloping surface 178 of the second wedge structure 174. The sloping surface 176 of the first wedge structure 172 and the sloping surface 178 of the second wedge structure 174 may be configured to hold an optical component. The optical component may be a lens or a fiber.

As shown in FIG. 1, the MEMS device 100 is at a rest position (i.e. when the MEMS device 100 has not started operating). When the MEMS device 100 is at a rest position, there may be a gap 180 between the second surface 116 of the first arm structure 106 and the first actuator 110 and a gap 182 between the second surface 120 of the second arm structure 108 and the second actuator 112. Also, the first pair of locking elements 150a, 150b and the second pair of locking elements 152a, 152b may be configured to engage with the first arm structure 106 and the second arm structure 108 respectively. The plurality of protruding portions 154 of the first pair of locking elements 150a, 150b may be received in the respective cavities 130 of the first arm structure 106, and the plurality of protruding portions 162 of the second pair of locking elements 152a, 152b may be received in the respective cavities 144 of the second arm structure 108. The plurality of protruding portions 126 of the first arm structure 106 may be received in the respective cavities 156 of the pair of locking elements 150a, 150b, and the plurality of protruding portions 142 of the second arm structure 108 may be received in the respective cavities 164 of the second pair of locking elements 152a, 152b. Such an arrangement of the MEMS device 100 can provide a rigid configuration of the positioning mechanism 102 and the locking mechanism 104. For example, movements of the first arm structure 106 and the second arm structure 108 can be limited when the MEMS device 100 is in a rest position. Better coarse alignment accuracy during an assembly of optical components into the holding mechanism 170 can be provided.

Figure 2A:
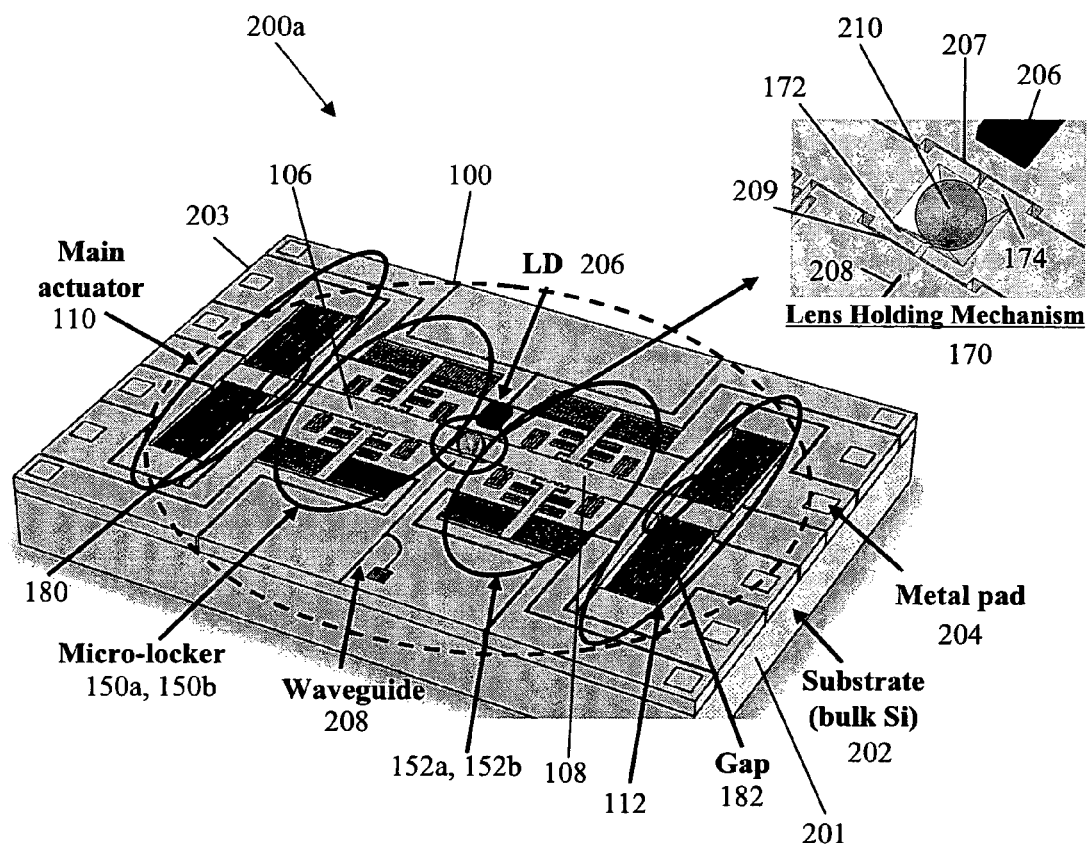
FIG. 2a shows an example implementation of a MEMS device.

FIG. 2a shows an example implementation 200a of the MEMS device 100. The MEMS device 100 may be fabricated on a bulk silicon substrate 202. A plurality of metal pads 204, a laser diode 206 and a waveguide 208 may be disposed on the bulk silicon substrate 202. The plurality of metal pads 204 may be disposed near edges 201, 203 of the bulk silicon substrate 202. The laser diode 206 and the waveguide 208 may be arranged such that the holding mechanism 170 of the MEMS device 100 is disposed between the laser diode 206 and the waveguide 208. The laser diode 206 may be disposed adjacent an edge 207 of the holding mechanism 170. The waveguide 208 may be disposed adjacent another edge 209 of the holding mechanism 170 opposite to the edge 207. In this implementation 200a, the first wedge structure 172 and the second wedge structure 174 of the holding mechanism 170 may be formed by e.g. an anisotropic silicon etching process. The holding mechanism 170 may be sized to hold a lens 210. The lens 210 may be a ball lens. The MEMS device 100 may adjust a position of the lens 210 such that the lens 210 is aligned with the laser diode 206 and the waveguide 208.

Figure 2B:
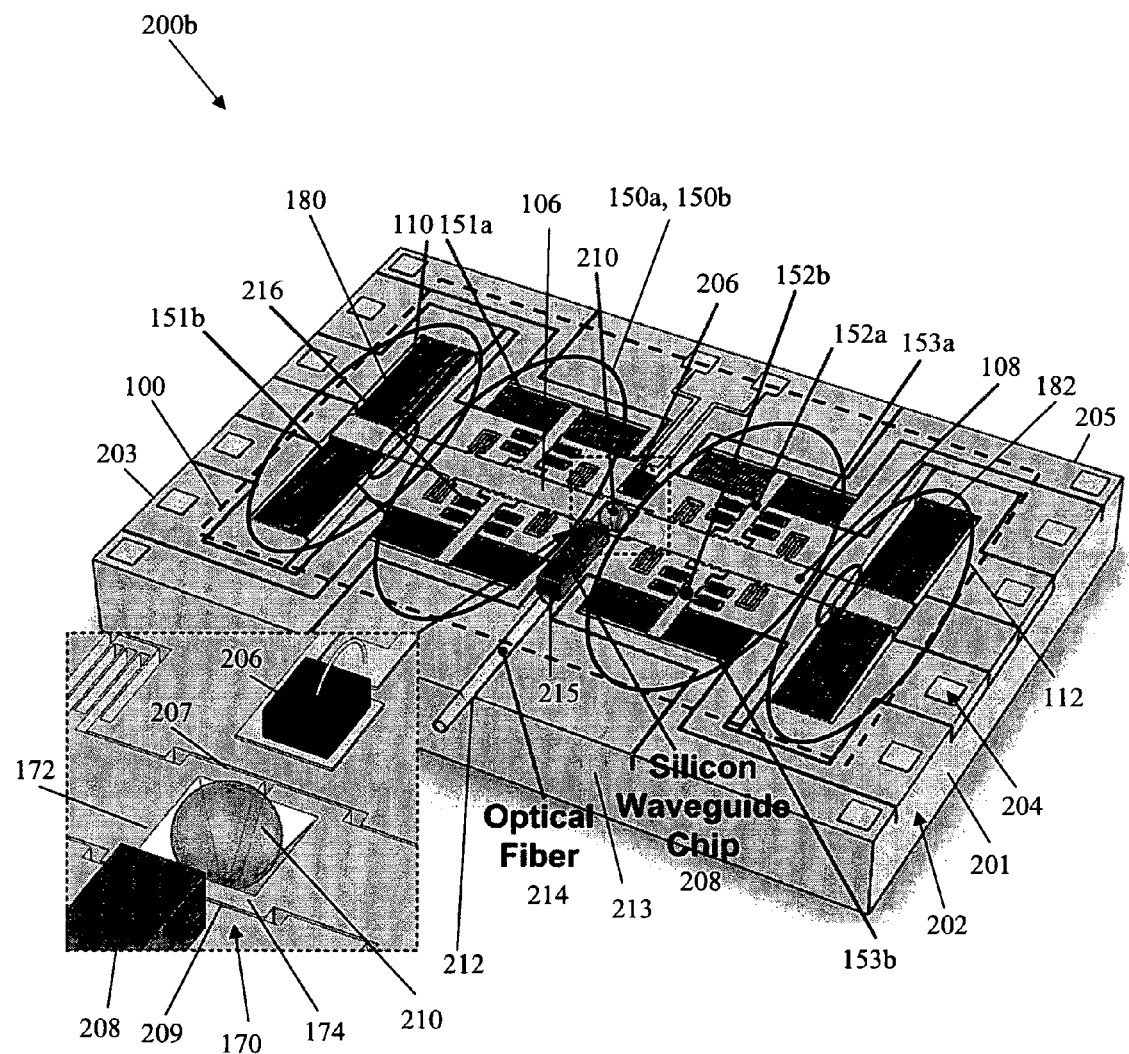
FIG. 2b shows another example implementation of a MEMS device.

FIG. 2b shows another example implementation 200b of the MEMS device 100. The MEMS device 100 may be fabricated on a bulk silicon substrate 202. A plurality of metal pads 204, a laser diode 206, a waveguide 208, and a groove 212 may be disposed on the bulk silicon substrate 202. The plurality of metal pads 204 may be disposed near edges 201, 203, 205 of the bulk silicon substrate 202. The laser diode 206 and the waveguide 208 may be arranged such that the holding mechanism 170 of the MEMS device 100 is disposed between the laser diode 206 and the waveguide 208. The laser diode 206 may be disposed adjacent an edge 207 of the holding mechanism 170. The waveguide 208 may be disposed adjacent another edge 209 of the holding mechanism 170 opposite to the edge 207. The waveguide 208 may be a silicon waveguide chip or other photonics chip. The groove 212 may extend from an edge 213 of the bulk silicon substrate 202 to an end 215 of the waveguide 208. The groove 212 may be V-shaped. In this implementation 200b, the first wedge structure 172 and the second wedge structure 174 of the holding mechanism 170 may be formed by e.g. an anisotropic silicon etching process. The holding mechanism 170 may be sized to hold a lens 210. The lens 210 may be a ball lens. The groove 212 may be configured to hold a fiber 214 (e.g. an optical fiber). The fiber 214 may be disposed adjacent to the waveguide 208. The MEMS device 100 may adjust a position of the lens 210 such that the lens 210 is aligned with the laser diode 206 and the waveguide 208. The movement of the locking elements 150a, 150b, 152a, 152b may be limited by restraining portions 216.

Figure 3:
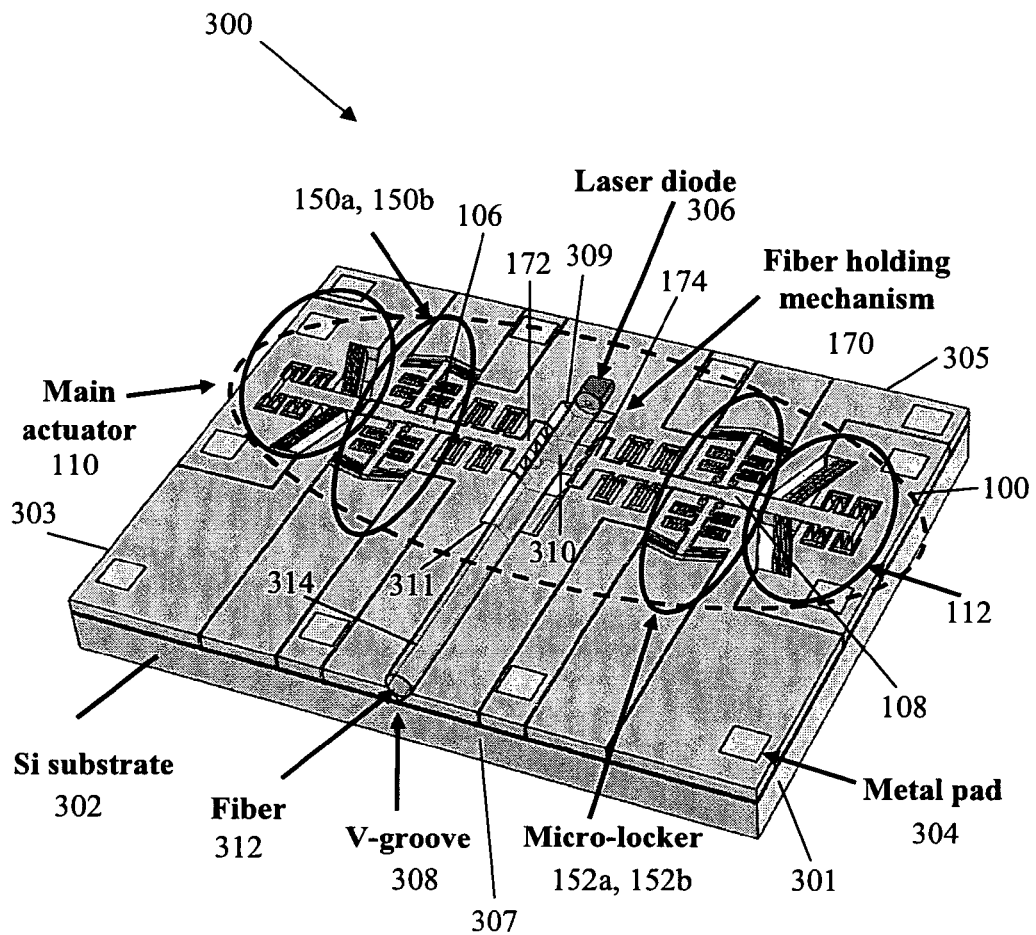
FIG. 3 shows another example implementation of a MEMS device.

FIG. 3 shows another example implementation 300 of the MEMS device 100. The MEMS device 100 may be fabricated on a bulk silicon substrate 302. A plurality of metal pads 304, a laser diode 306 and a groove 308 may be disposed on the bulk silicon substrate 302. The plurality of metal pads 304 may be disposed near edges 301, 303, 305, 307 of the bulk silicon substrate 302. The laser diode 306 may be disposed adjacent an edge 309 of the holding mechanism 170. The groove 308 may extend from the edge 307 of the bulk silicon substrate 302 to another edge 311 of the holding mechanism 170 opposite to the edge 309. The groove 308 may be V-shaped. In this implementation 300, the first wedge structure 172 and the second wedge structure 174 of the holding mechanism 170 may be formed by e.g. an anisotropic silicon etching process. The holding mechanism 170 of the MEMS device 100 may be sized to hold a portion 310 of a fiber 312. The groove 308 may be configured to hold another portion 314 of the fiber 312. The MEMS device 100 may adjust a position of the fiber 312 such that the fiber 312 is aligned with the laser diode 306.

Figure 4:
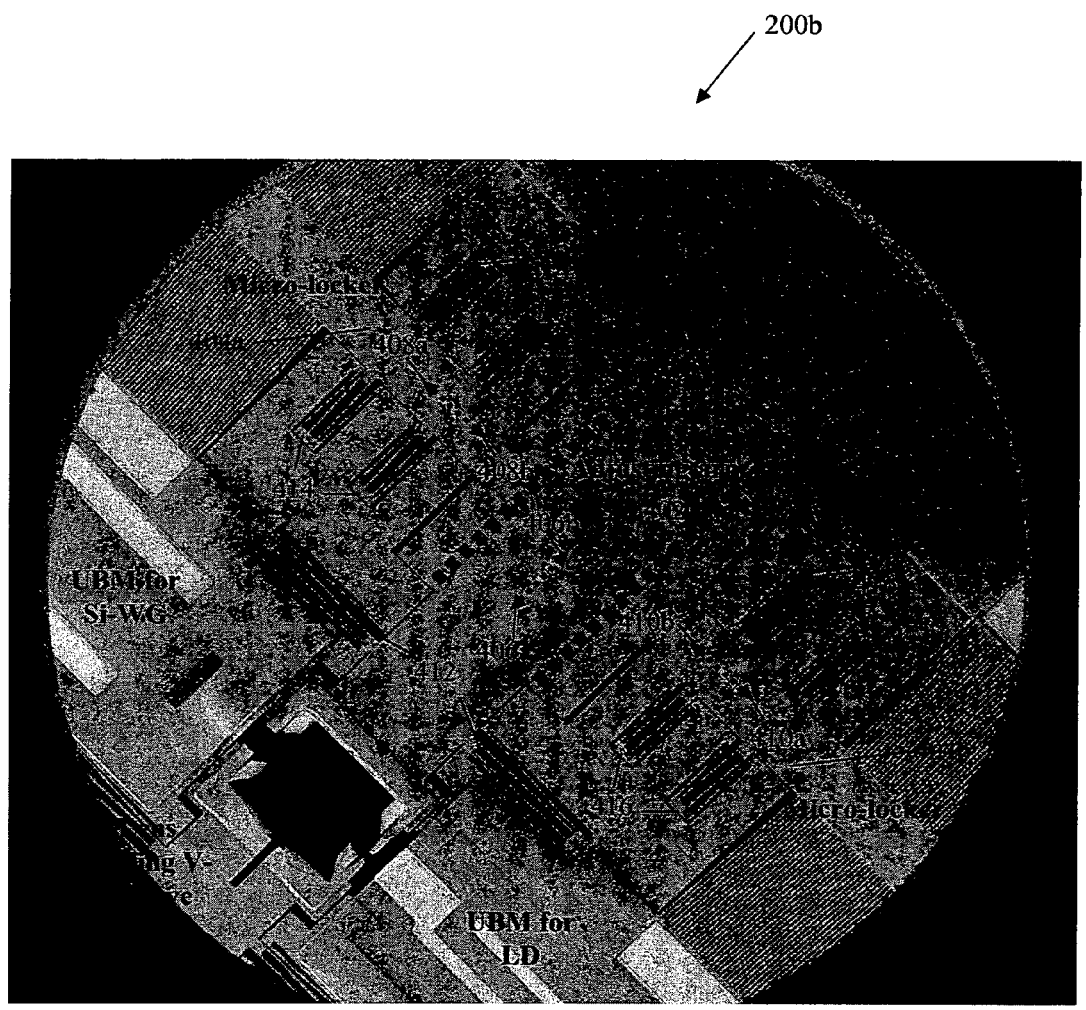
FIG. 4 shows a portion of the example implementation of the MEMS device of FIG. 2b.

FIG. 4 shows a portion of the example implementation 200b of the MEMS device 100 of FIG. 2b. FIG. 4 indicates respective movements of an arm structure 402 (e.g. a first arm structure 106, a second arm structure 108) and a pair of locking elements 404a, 404b (e.g. a first pair of locking elements 150a, 150b, a second pair of locking elements 152a, 152b) when the MEMS device 100 starts operating. The arm structure 402 may move along directions 406a, 406b. The locking element 404a may move along directions 408a, 408b. The locking element 404b may move along directions 410a, 410b. The movement of the arm structure 402 may be limited by restraining portions 412. The movement of the locking element 404a may be limited by restraining portions 414. The movement of the locking element 404b may be limited by restraining portions 416.

Figure 5:
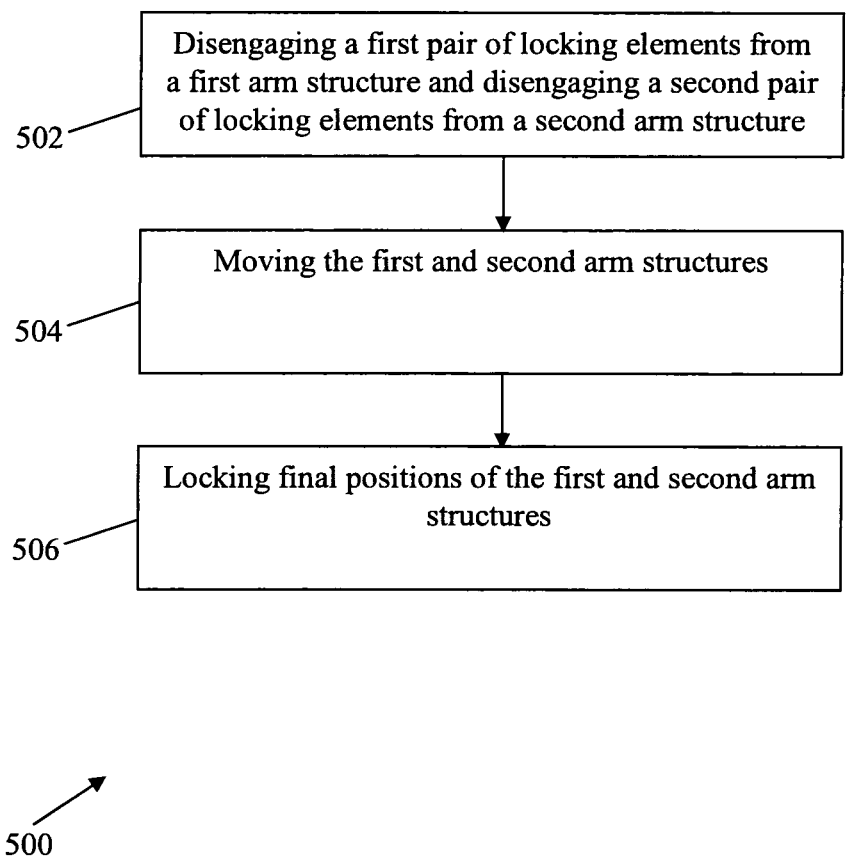
FIG. 5 shows a flowchart of operating a MEMS device.

FIG. 5 shows a flowchart 500 of operating the MEMS device 100. At 502, a first pair of locking elements is disengaged from a first arm structure and a second pair of locking elements is disengaged from a second arm structure. At 504, the first and second arm structures are moved. At 506, final positions of the first and second arm structures are locked.

Details of operating the MEMS device 100 are described in the following.

Figure 6A:
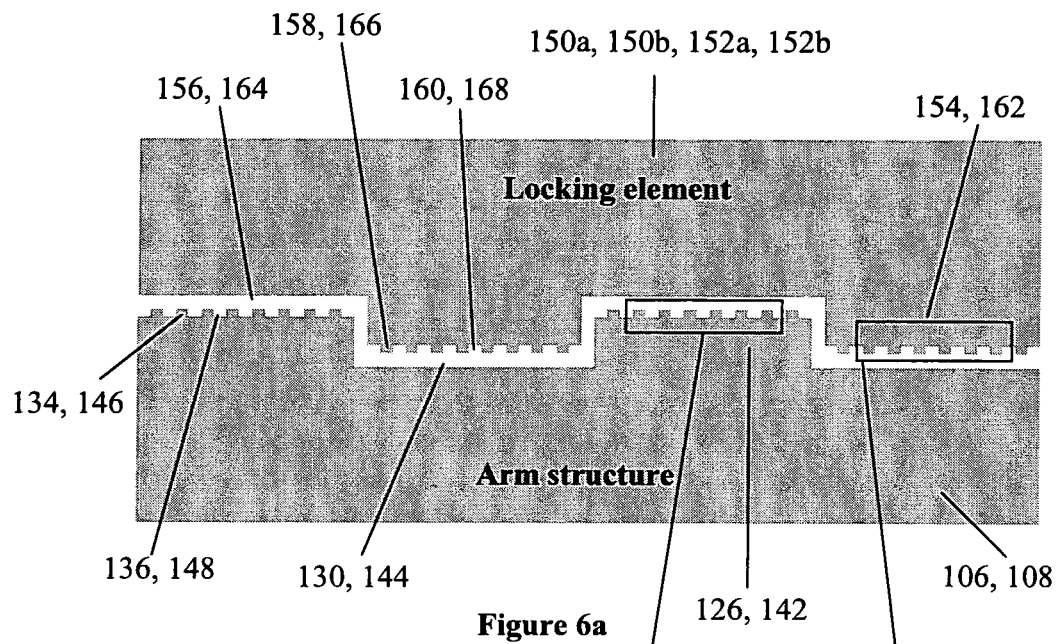
FIG. 6a shows a first pair of locking elements and a second pair of locking elements engaging with a first arm structure and a second arm structure respectively.
Figure 6B:
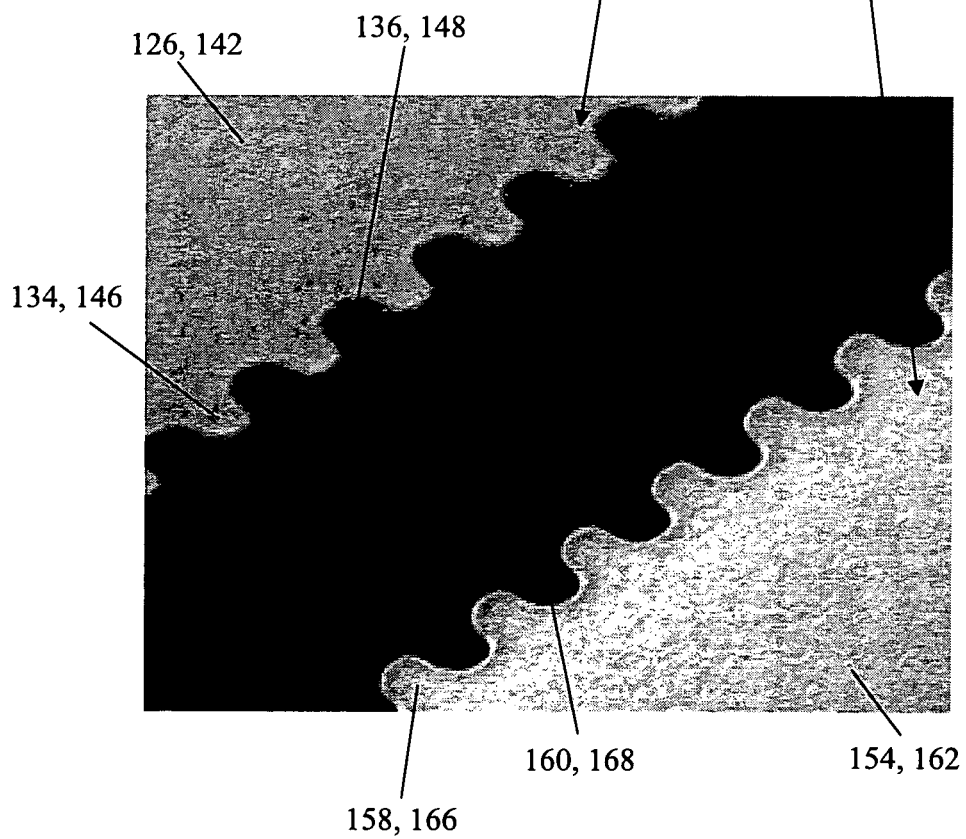
FIG. 6b shows an enlarged scanning electron microscopy (SEM) image of a plurality of tooth structures.
Figure 6C:
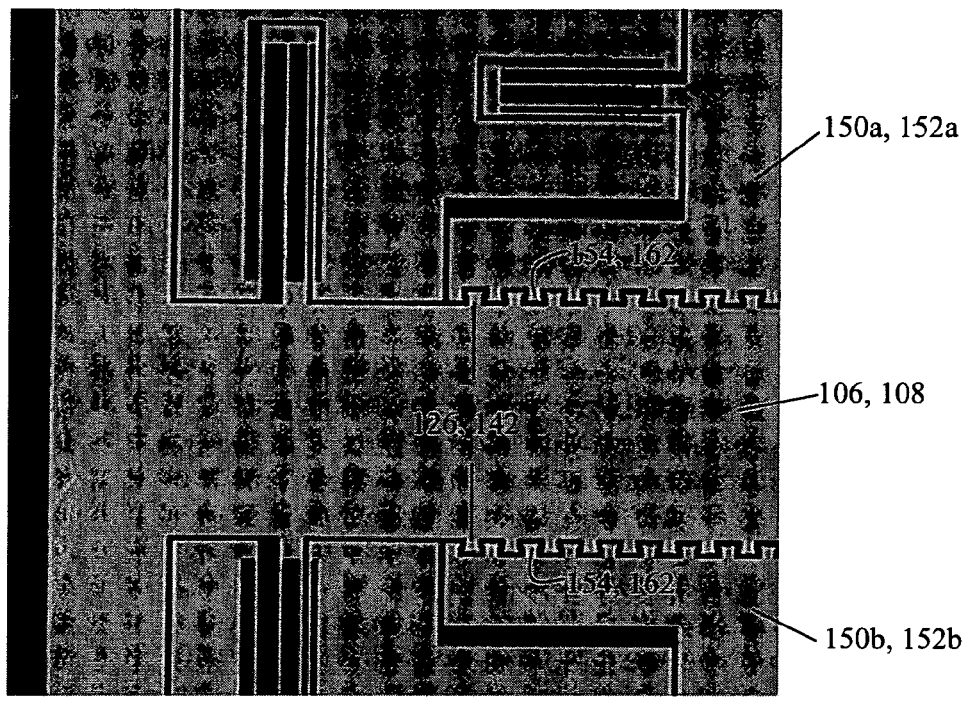
FIG. 6c shows a first pair of locking elements and a second pair of locking elements engaging with a first arm structure and a second arm structure respectively.

Before the MEMS device 100 starts operating, the first pair of locking elements 150a, 150b and the second pair of locking elements 152a, 152b may engage with the first arm structure 106 and the second arm structure 108 respectively, as shown in FIGS. 6a and 6c. The plurality of protruding portions 154 of the first pair of locking elements 150a, 150b may be received in the respective cavities 130 of the first arm structure 106, and the plurality of protruding portions 162 of the second pair of locking elements 152a, 152b may be received in the respective cavities 144 of the second arm structure 108. The plurality of protruding portions 126 of the first arm structure 106 may be received in the respective cavities 156 of the pair of locking elements 150a, 150b, and the plurality of protruding portions 142 of the second arm structure 108 may be received in the respective cavities 164 of the second pair of locking elements 152a, 152b.

FIG. 6b shows an enlarged scanning electron microscopy (SEM) image of the plurality of tooth structures 134, 146 of the plurality of protruding portions 126, 142 and the plurality of tooth structures 158, 166 of the plurality of protruding portions 154, 162. Each tooth structure 134, 146, 158, 166 may have a pitch of about 0.4 μm and a width ranging between about 0.2 μm and about 0.4 μm.

Figure 6D:
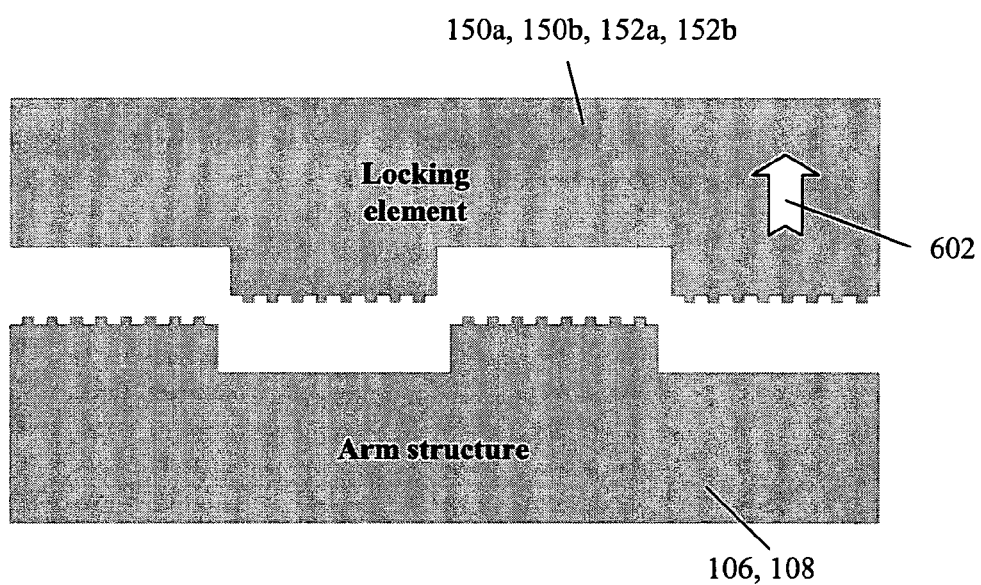
FIG. 6d shows a first pair of locking elements and a second pair of locking elements disengaging from a first arm structure and a second arm structure respectively.

Once the MEMS device 100 starts operating, a power may be supplied to the first pair of locking elements 150a, 150b and the second pair of locking elements 152a, 152b. The first pair of locking elements 150a, 150b and the second pair of locking elements 152a, 152b may disengage and move away from the first arm structure 106 and the second arm structure 108 respectively in a direction 602 as shown in FIG. 6d.

Figure 6E:
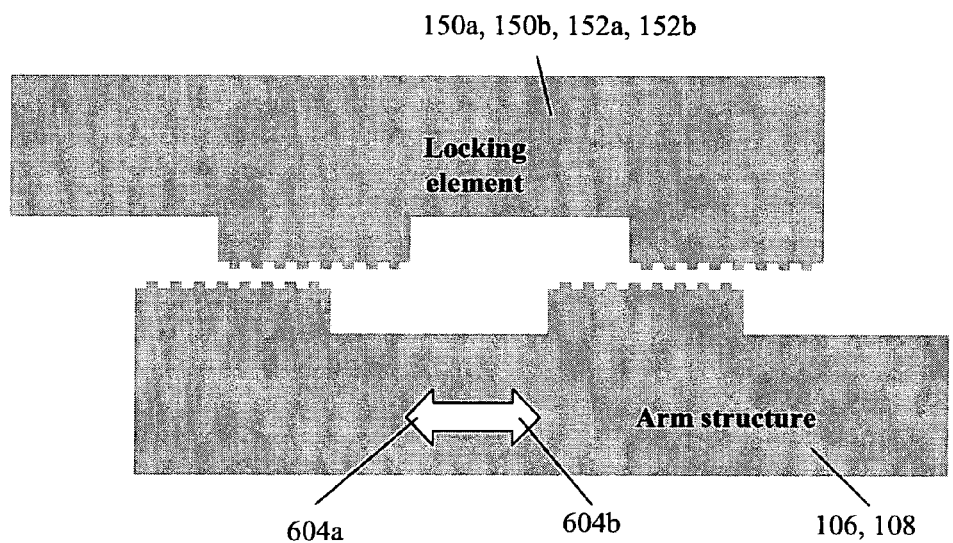
FIG. 6e shows a movement of a first arm structure and a second arm structure.

A power may also be supplied to the first actuator 110 and the second actuator 112. The first actuator 110 and the second actuator 112 may move towards or away from the first arm structure 106 and the second arm structure 108 respectively to move the first arm structure 106 and the second arm structure 108. The first arm structure 106 and the second arm structure 108 may move in directions 604a, 604b as shown in FIG. 6e.

After final positions of the first arm structure 106 and the second arm structure 108 are determined (e.g. when the optical component is aligned to a laser diode), the power supplied to the first pair of locking elements 150a, 150b and the second pair of locking elements 152a, 152b may be switched off. The first pair of locking elements 150a, 150b and the second pair of locking elements 152a, 152b may move towards the first arm structure 106 and the second arm structure 108 respectively in a direction 606 as shown in FIG. 6f.

A restoring force may be provided to both the first pair of locking elements 150a, 150b and the second pair of locking elements 152a, 152b to move the first pair of locking elements 150a, 150b and the second pair of locking elements 152a, 152b back to the initial positions. However, since the first arm structure 106 and the second arm structure 108 have moved away from the original positions, the plurality of protruding portions 154 of the first pair of locking elements 150a, 150b will not be received in the respective cavities 130 of first arm structure 106, and the plurality of protruding portions 162 of the second pair of locking elements 152a, 152b will not be received in the respective cavities 144 of the second arm structure 108.

Figure 6F:
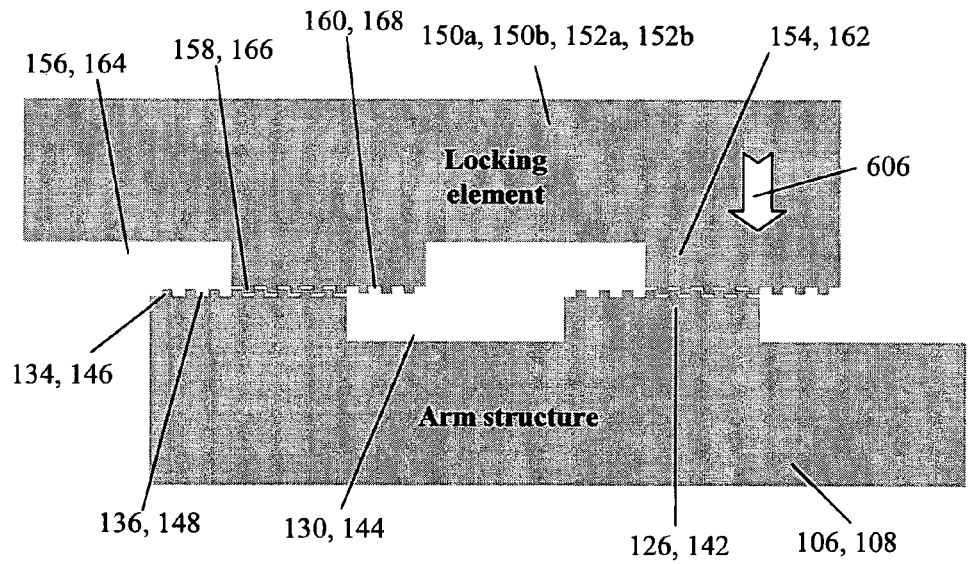
FIGS. 6f and 6g show a first pair of locking elements and a second pair of locking elements engaging with a first arm structure and a second arm structure respectively.
Figure 6G:
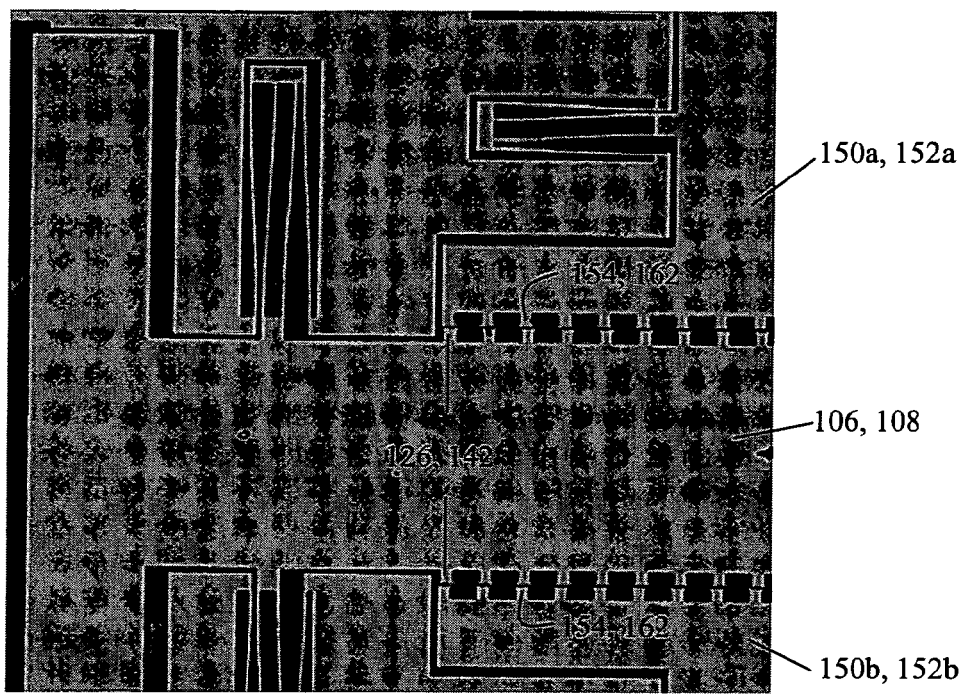
Figure 6H:
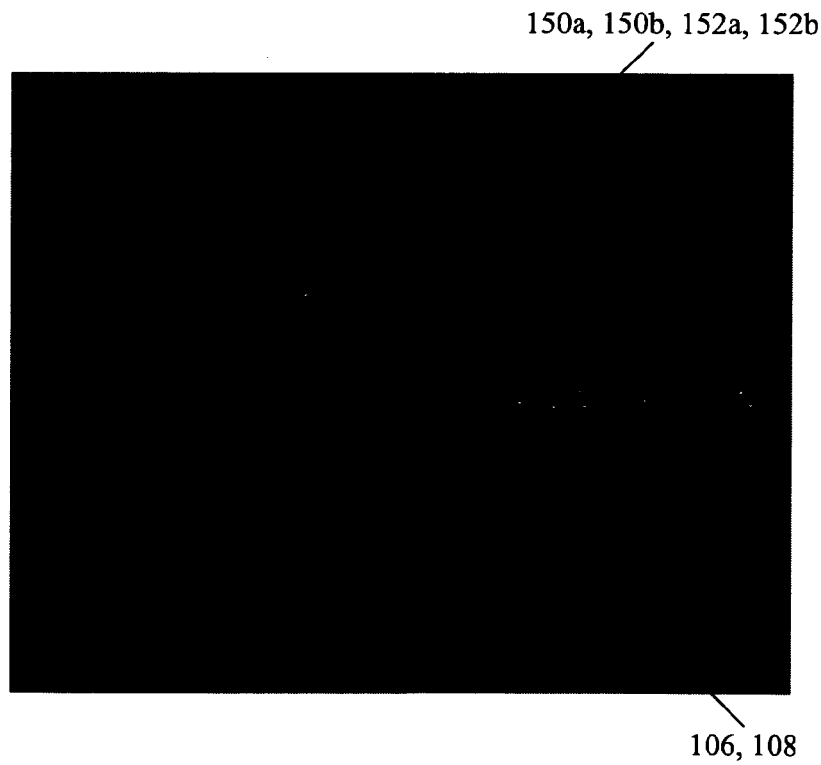
FIG. 6h shows an enlarged drawing of a plurality of tooth structures of an locking element engaging with a plurality of tooth structures of an arm structure.

Instead, as shown in both FIGS. 6f, 6g and 6h, the first pair of locking elements 150a, 150b and the second pair of locking elements 152a, 152b may engage the first arm structure 106 and the second arm structure 108 in a manner such that the plurality of tooth structures 158 of the first pair of locking elements 150a, 150b interlock with the plurality of tooth structures 134 of the first arm structure 106 and the plurality of tooth structures 166 of the second pair of locking elements 152a, 152b interlock with the plurality of tooth structures 146 of the second arm structure 108. The plurality of tooth structures 158 of the first pair of locking elements 150a, 150b may be received in the respective cavities 136 of the first arm structure 106 and the plurality of tooth structures 134 of the first arm structure 106 may be received in the respective cavities 160 of the first pair of locking elements 150a, 150b. The plurality of tooth structures 166 of the second pair of locking elements 152a, 152b may be received in the respective cavities 148 of the second arm structure 108 and the plurality of tooth structures 146 of the second arm structure 108 may be received in the respective cavities 168 of the second pair of locking elements 152a, 152b.

The plurality of tooth structures 134 of the first arm structure 106, the plurality of tooth structures 146 of the second arm structure 108, the plurality of tooth structures 158 of the first pair of locking elements 150a, 150b, and the plurality of tooth structures 166 of the second pair of locking elements 152a, 152b provide an increased friction force between the first arm structure 106 and the first pair of locking elements 150a, 150b, and between the second arm structure 108 and the second pair of locking elements 152a, 152b. Thus, a stronger locking force may be exerted on the first arm structure 106 and the second arm structure 108 respectively to lock the final positions of the first arm structure 106 and the second arm structure 108.

To increase friction force between the first arm structure 106 and the first pair of locking elements 150a, 150b, and between the second arm structure 108 and the second pair of locking elements 152a, 152b, the plurality of tooth structures 134, 146, 158, 166 may be formed on the respective protruding portions 126, 142, 154, 162 by a lithography process. The plurality of tooth structures 134, 146, 158, 166 may be formed using deep reactive ion etching and BOSCH process. As such, the roughness of the surfaces of the plurality of tooth structures 134, 146, 158, 166 and the corresponding cavities 136, 148, 160, 168 may be increased which provide a higher friction force for locking purposes.

In addition, since the first pair of locking elements 150a, 150b and the second pair of locking elements 152a, 152b are not restored back to the initial positions, the restoring force provided on the first pair of locking elements 150a, 150b and the second pair of locking elements 152a, 152b may be exerted on the first arm structure 106 and the second arm structure 108 respectively. Therefore, a strong and stable locking force may be exerted on the first arm structure 106 and the second arm structure 108 respectively. In this way, the final positions of the first arm structure 106 and the second arm structure 108 may be locked.

After the final positions of the first arm structure 106 and the second arm structure 108 are locked, the power supplied to the first actuator 110 and the second actuator 112 may be switched off. Therefore, the optical component held by the holding mechanism 170 of the MEMS device 100 can be held in place without any power supplied to the first actuator 110, the second actuator 112, the first pair of locking elements 150a, 150b and the second pair of locking elements 152a, 152b. Further, the first actuator 110 and the second actuator 112 may move away from the first arm structure 106 and the second arm structure 108 respectively back to the initial positions after the power supplied to the first actuator 110 and the second actuator 112 is switched off. Thus, no restoring force is exerted on the first arm structure 106 and the second arm structure 108.

The positioning and locking process described above and as shown in FIGS. 6a to 6h can be implemented without visualization and can be reversible. The final positions of the first arm structure 106 and the second arm structure 108 may be locked mechanically, without maintaining power to the positioning mechanism 102 and the locking mechanism 104. The MEMS device can advantageously provide a simple implementation of the positioning mechanism 102 and the locking mechanism 104. The MEMS device 100 can also advantageously provide a higher alignment and locking accuracy (e.g. about 0.1 µm step resolution/shift error). Therefore, an improved optical coupling efficiency of optical components can be advantageously achieved. The MEMS device 100 can be applied in for example photonics packaging.

Figure 7:
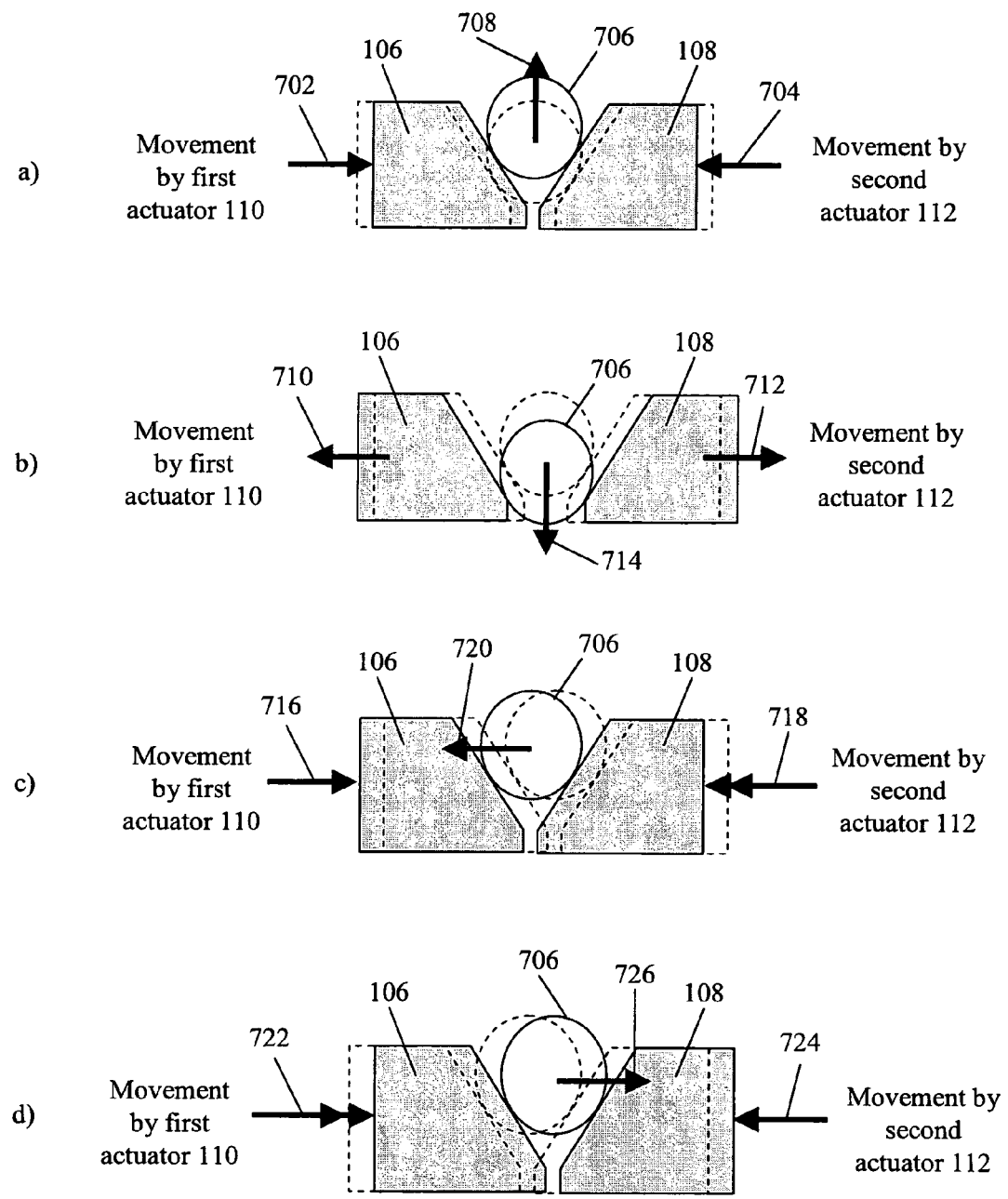
FIGS. 7a to 7d show schematic diagrams of a first actuator and a second actuator moving a first arm structure and a second arm structure respectively.

FIGS. 7a to 7d show schematic diagrams of the first actuator 110 and the second actuator 112 moving the first arm structure 106 and the second arm structure 108 respectively. FIG. 7a shows the first actuator 110 moving the first arm structure 106 in a direction 702 and the second actuator 112 moving the second arm structure 108 in a direction 704. A same amount of power may be supplied to both the first arm structure 106 and the second arm structure 108. The first arm structure 106 and the second arm structure 108 may then move towards each other at a same speed. Thus, an optical component 706 may move upwards in a direction 708.

FIG. 7b shows the first actuator 110 moving the first arm structure 106 in a direction 710 and the second actuator 112 moving the second arm structure 108 in a direction 712. A same amount of power may be supplied to both the first arm structure 106 and the second arm structure 108. The first arm structure 106 and the second arm structure 108 may then move away from each other at a same speed. Thus, the optical component 706 may move downwards in a direction 714.

FIG. 7c shows the first actuator 110 moving the first arm structure 106 in a direction 716 and the second actuator 112 moving the second arm structure 108 in a direction 718. A larger amount of power may be supplied to the second arm structure 108. The first arm structure 106 and the second arm structure 108 may then move towards each other. However, the second arm structure 108 may move towards the first arm structure 106 at a faster speed. Thus, the optical component 706 may move from right to left in a direction 720.

FIG. 7d shows the first actuator 110 moving the first arm structure 106 in a direction 722 and the second actuator 112 moving the second arm structure 108 in a direction 724. A larger amount of power may be supplied to the first arm structure 106. The first arm structure 106 and the second arm structure 108 may then move towards each other. However, the first arm structure 106 may move towards the second arm structure 108 at a faster speed. Thus, the optical component 706 may move from left to right in a direction 726.

The positioning mechanism 102 can advantageously provide a two degree of freedom positioning of the optical component 706.

Figure 8A:
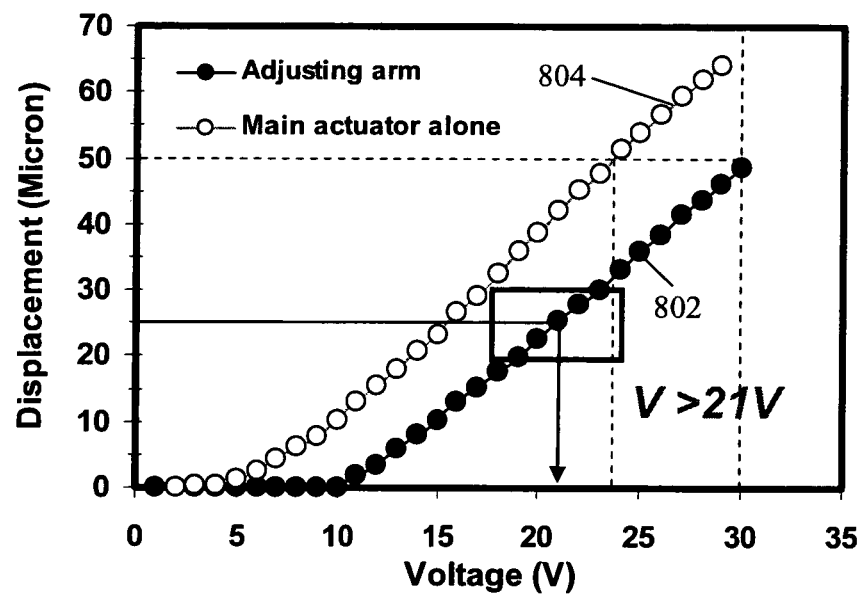
FIG. 8a shows a graph of a displacement of an arm structure against a voltage applied to an actuator and a graph of a displacement of an actuator against a voltage applied to the actuator.

FIG. 8a shows a graph 802 of a displacement of an arm structure against a voltage applied to an actuator. FIG. 8a also shows a graph 804 of a displacement of an actuator against a voltage applied to the actuator. From graph 802, it can be observed that a voltage of about 30 V applied to the actuator causes the arm structure to move a distance of about 50 μm. From graph 804, it can be observed that the actuator alone without loading will move a distance close to 70 μm when a voltage of about 30 V is applied to the actuator. Therefore, a greater displacement of the actuator is required to drive the arm structure. The designed displacement of the arm structure in this example is around 25 μm which requires the voltage applied to the actuator to be larger than 21V.

Figure 8B:
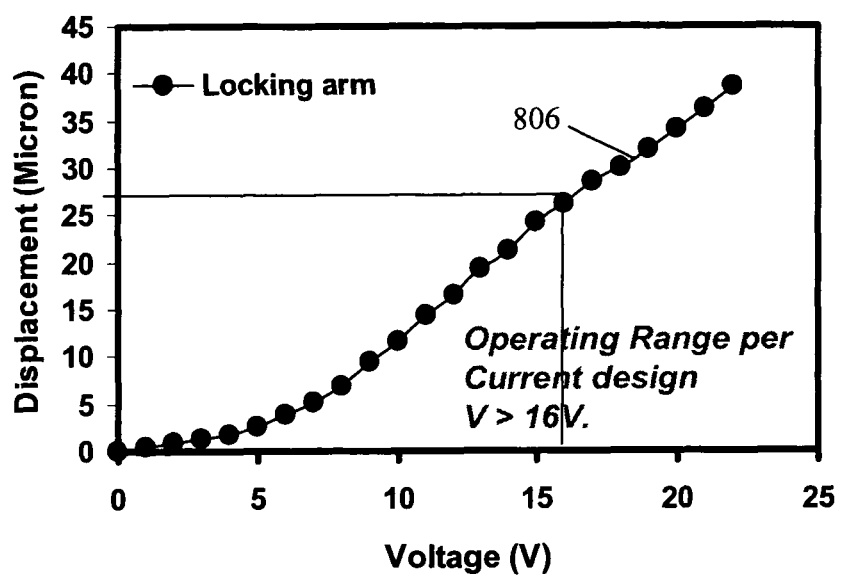
FIG. 8b shows a graph of a displacement of a locking element against a voltage applied to the locking element.

FIG. 8b shows a graph 806 of a displacement of a locking element against a voltage applied to the locking element. From graph 806, it can be observed that it requires a voltage of more than 16 V to move the locking element away from a position that engages with the arm structure. Further, the locking element can withstand a mechanical vibration of about 10 g at about 2 kHz.

Figure 9:
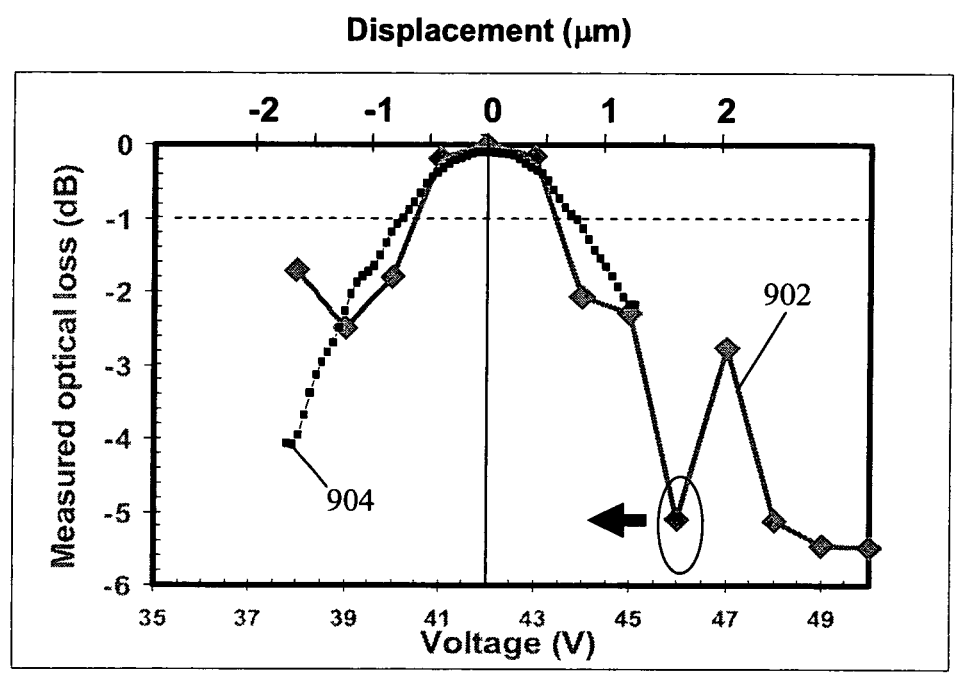
FIG. 9 shows a graph of a measured optical loss against a voltage applied to the actuator and a graph of the measured optical loss against a displacement of an optical component from a laser diode.

FIG. 9 shows a graph 902 of a measured optical loss against a voltage applied to the actuator. FIG. 9 also shows a graph 904 of the measured optical loss against a displacement of an optical lensed fiber from a laser diode. From graph 902, it can be observed that the measured optical loss is zero at a voltage of about 42 V. From graph 904, it can be observed that the measured optical loss is zero when the optical component is aligned with the laser diode (e.g. zero displacement from the laser diode in the direction perpendicular to the optical path).

Figure 10:
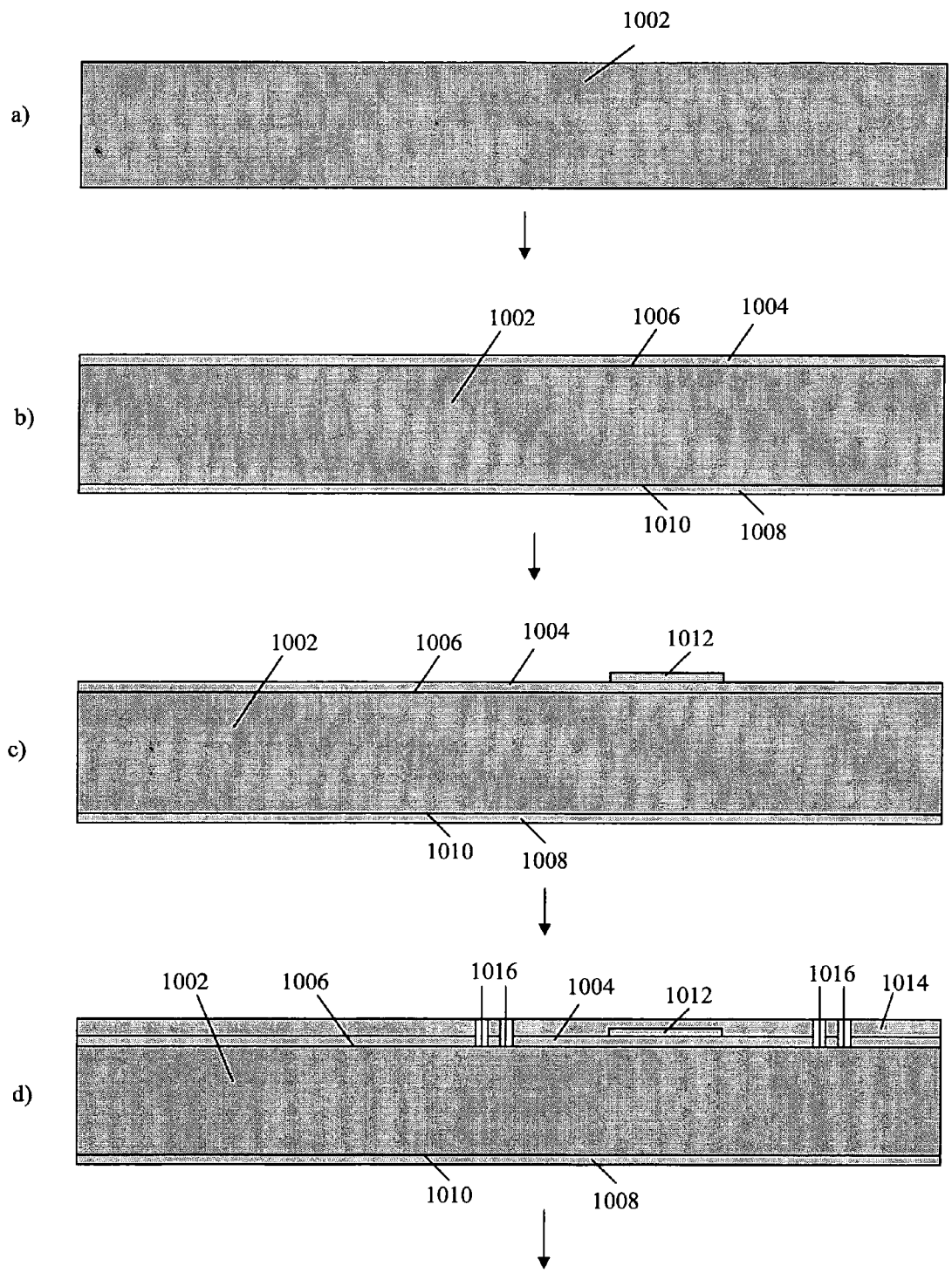
FIGS. 10a to 10l show a first exemplary process of forming a MEMS device.
Figure 10:
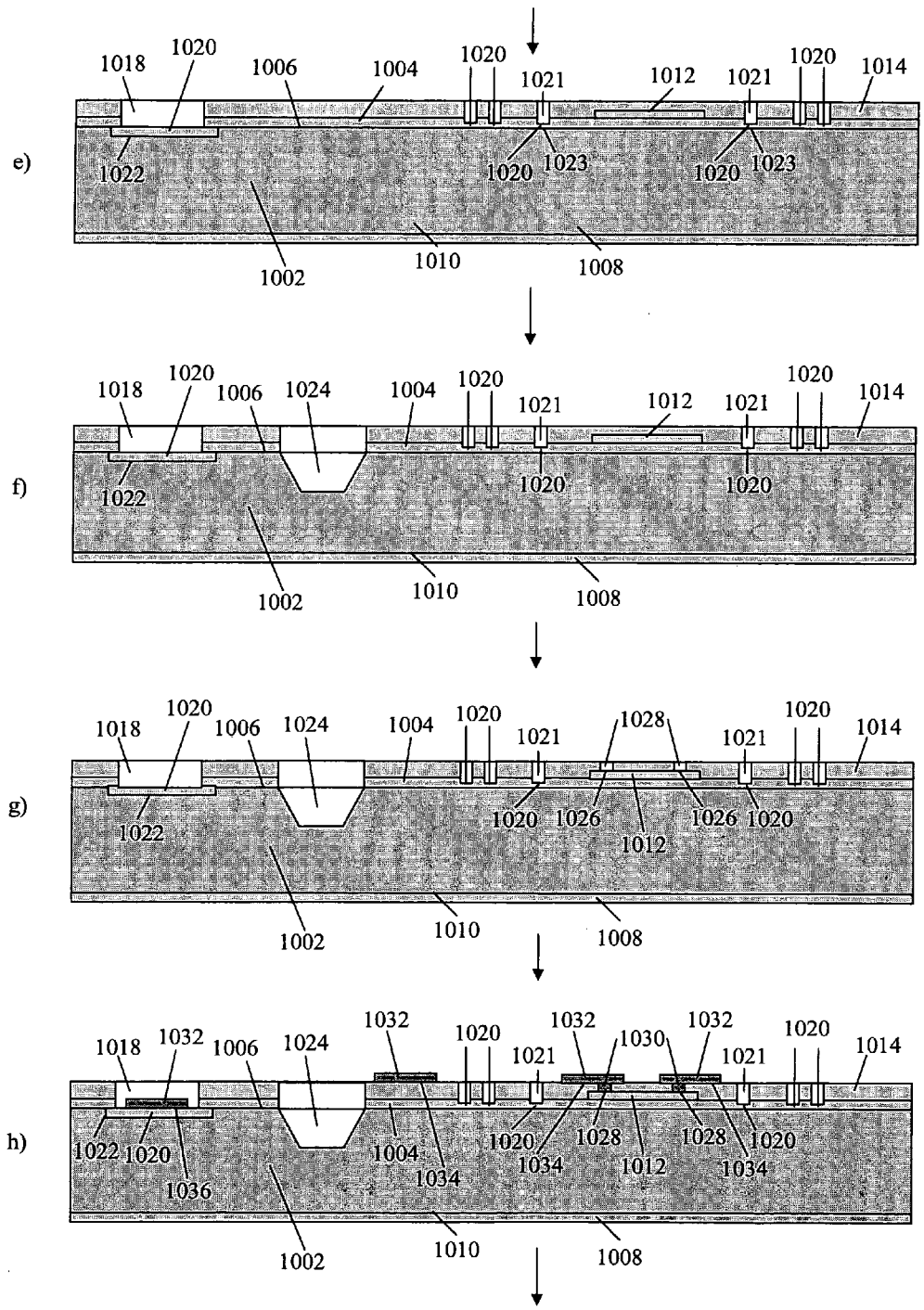
Figure 10:
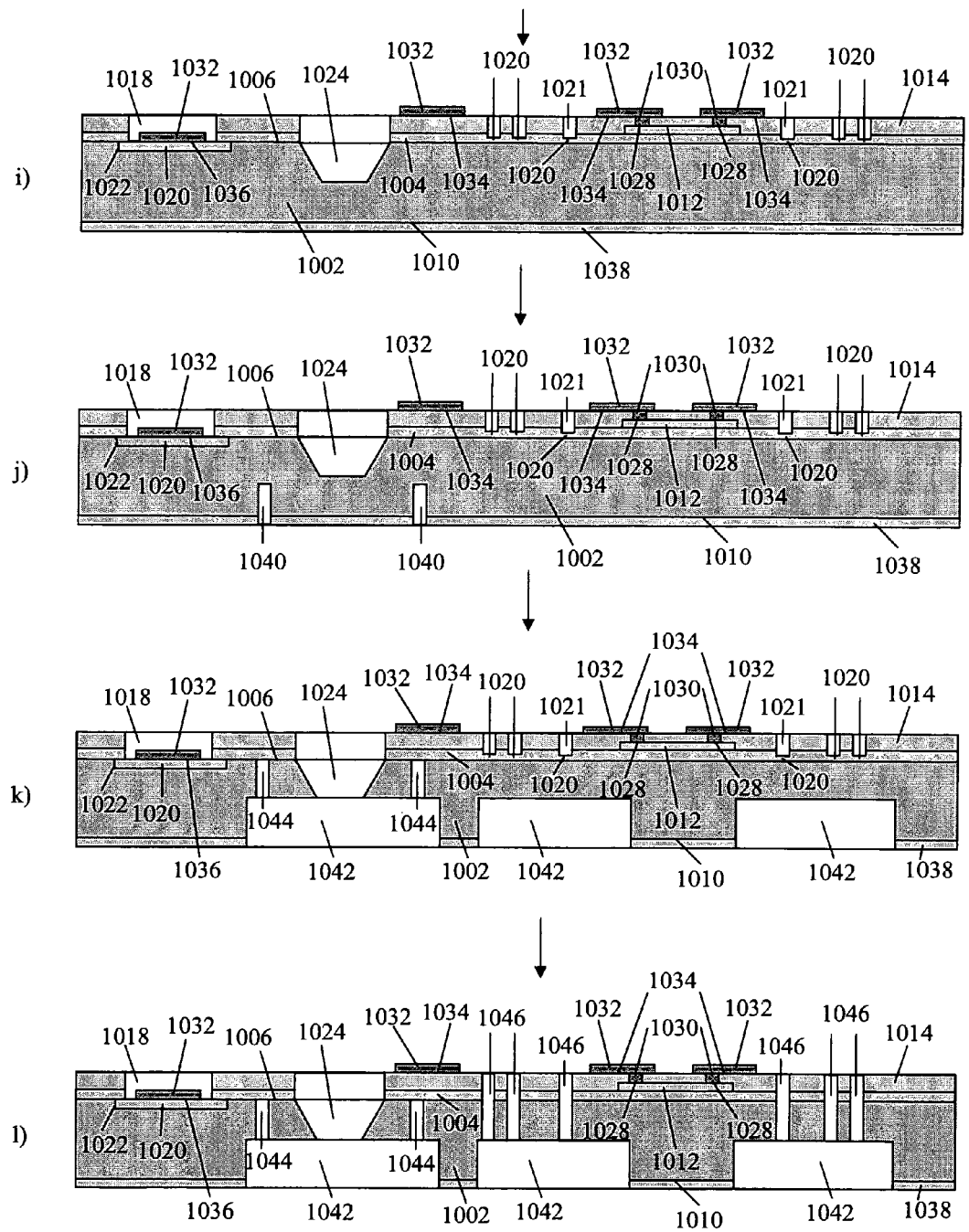

FIGS. 10a to 10l show a first exemplary process of forming the MEMS device 100. FIG. 10a shows a silicon wafer 1002. FIG. 10b shows a first layer 1004 of oxide deposited above a first surface 1006 of a silicon wafer 1002 and a second layer 1008 of oxide above a second surface 1010 of the silicon wafer 1002. The first layer 1004 of oxide and the second layer 1008 of oxide may be deposited respectively above the first surface 1006 and the second surface 1010 of the silicon wafer 1002 by low pressure chemical vapor deposition. FIG. 10c shows a layer 1012 of polysilicon above the first layer 1004 of oxide. The layer 1012 of polysilicon may be doped and patterned to expose the first layer 1004 of oxide.

FIG. 10d shows a third layer 1014 of oxide deposited above the layer 1012 of polysilicon and the exposed first layer 1004 of oxide. The third layer 1014 of oxide and the first layer 1004 of oxide may be patterned and etched to expose parts 1016 of the silicon wafer 1002. FIG. 10e shows a cavity 1018 etched in the third layer 1014 of oxide, the first layer 1004 of oxide and the silicon wafer 1002. Cavities 1021 may also be etched in the third layer 1014 of oxide and the first layer 1004 of oxide to expose parts 1023 of the silicon wafer 1002. A fourth layer 1020 of oxide may be deposited in a portion 1022 of the cavity 1018 in the silicon wafer 1002 and may be deposited over the exposed parts 1016, 1023 of the silicon wafer 1002.

FIG. 10f shows a groove 1024 patterned and etched in the third layer 1014 of oxide, the first layer 1004 of oxide and the silicon wafer 1002. The groove 1024 may be etched in Tetra-Methyl-Ammonium Hydroxide. FIG. 10g shows that the third layer 1014 of oxide above the layer 1012 of polysilicon is etched to expose parts 1026 of the layer 1012 of polysilicon. Etched areas 1028 may be formed in the third layer 1014 of oxide. FIG. 10h shows metal 1030 deposited in the etched areas 1028 in the third layer 1014 of oxide. A layer 1032 of metal may be deposited and patterned such that portions 1034 of the third layer 1014 of oxide and a portion 1036 of the fourth layer 1020 of oxide are covered by the layer 1032 of metal.

FIG. 10i shows that wafer thinning is performed on the second surface 1010 of the silicon wafer 1002. The second layer 1008 of oxide is removed. A fifth layer 1038 of oxide may be deposited above the second surface 1010 of the silicon wafer 1002. FIG. 10j shows a first trench etching performed in the fifth layer 1038 of oxide and the silicon wafer 1002. Cavities 1040 may be formed in the fifth layer 1038 of oxide and the silicon wafer 1002. FIG. 10k shows a second trench etching performed in the fifth layer 1038 of oxide and the silicon wafer 1002. Trenches 1042 may be formed in the fifth layer 1038 of oxide and the silicon wafer 1002. Cavities 1044 may be formed in the silicon wafer 1002. FIG. 10l shows a deep reactive ion etching performed above the first surface 1006 of the silicon wafer 1002. Cavities 1046 may be formed through the fourth layer 1020 of oxide and the silicon wafer 1002 to the trenches 1042. An oxide strip may be performed.

Figure 11:
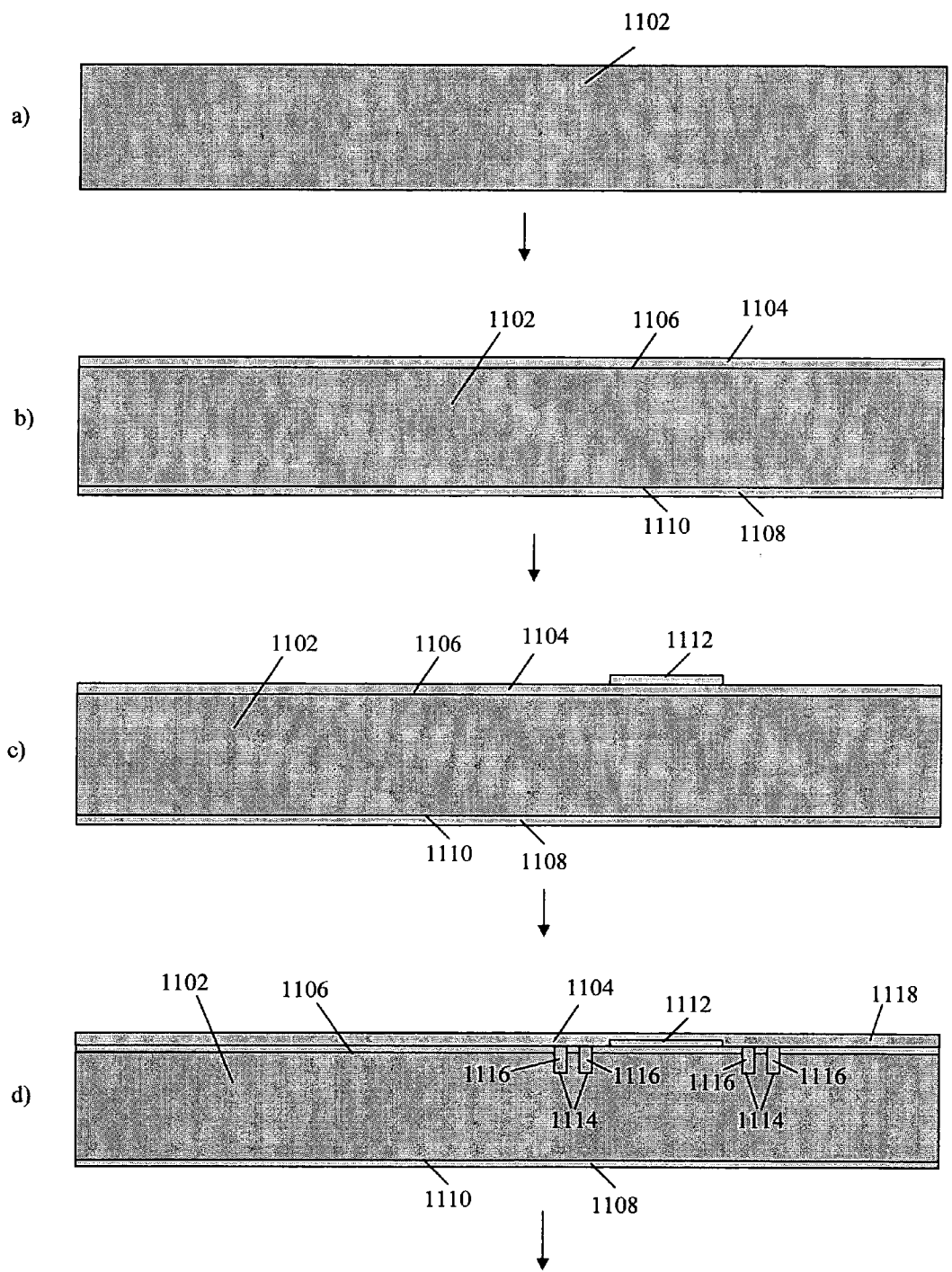
FIGS. 11a to 11l show a second exemplary process of forming a MEMS device.
Figure 11:
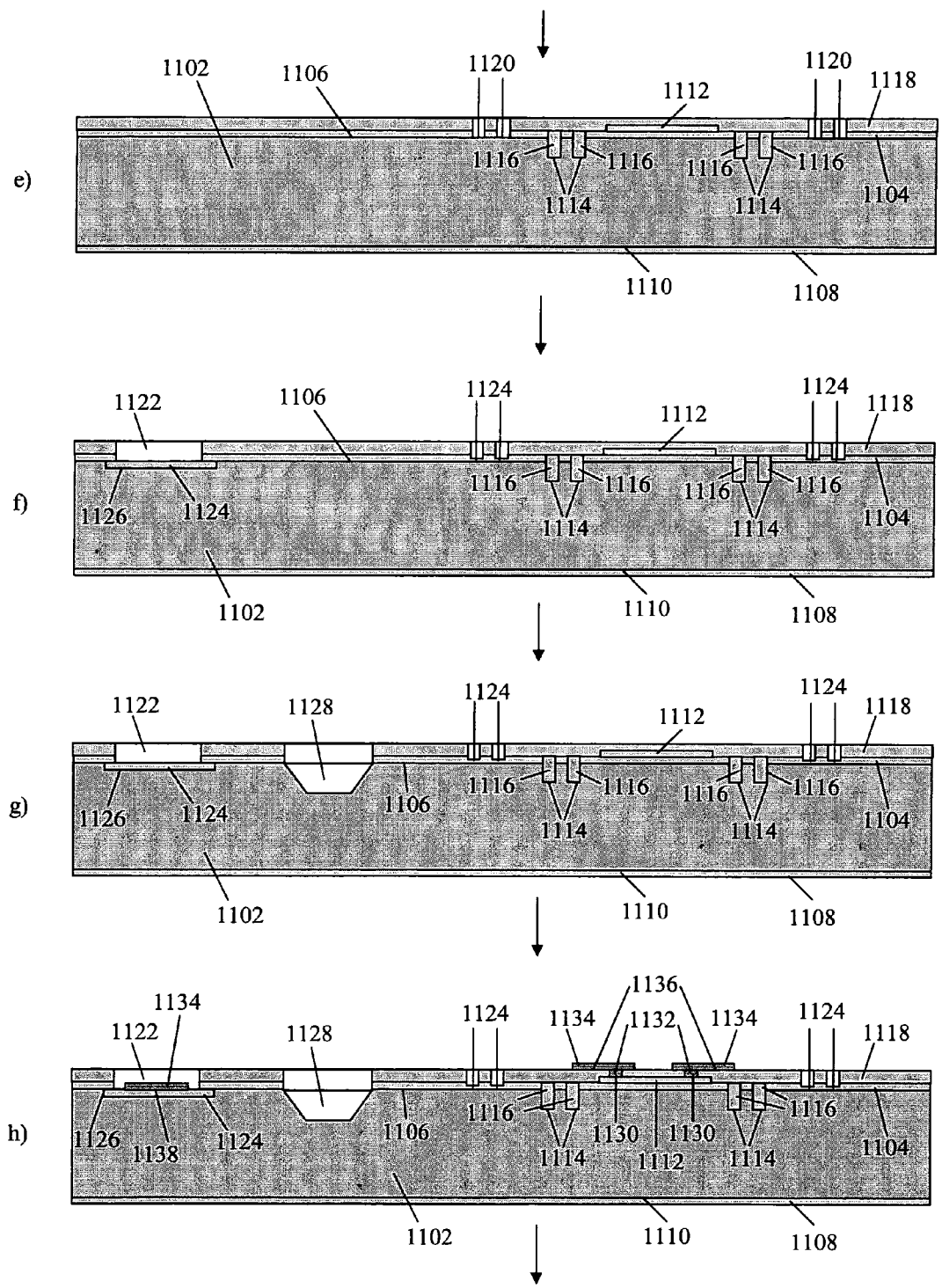
Figure 11:
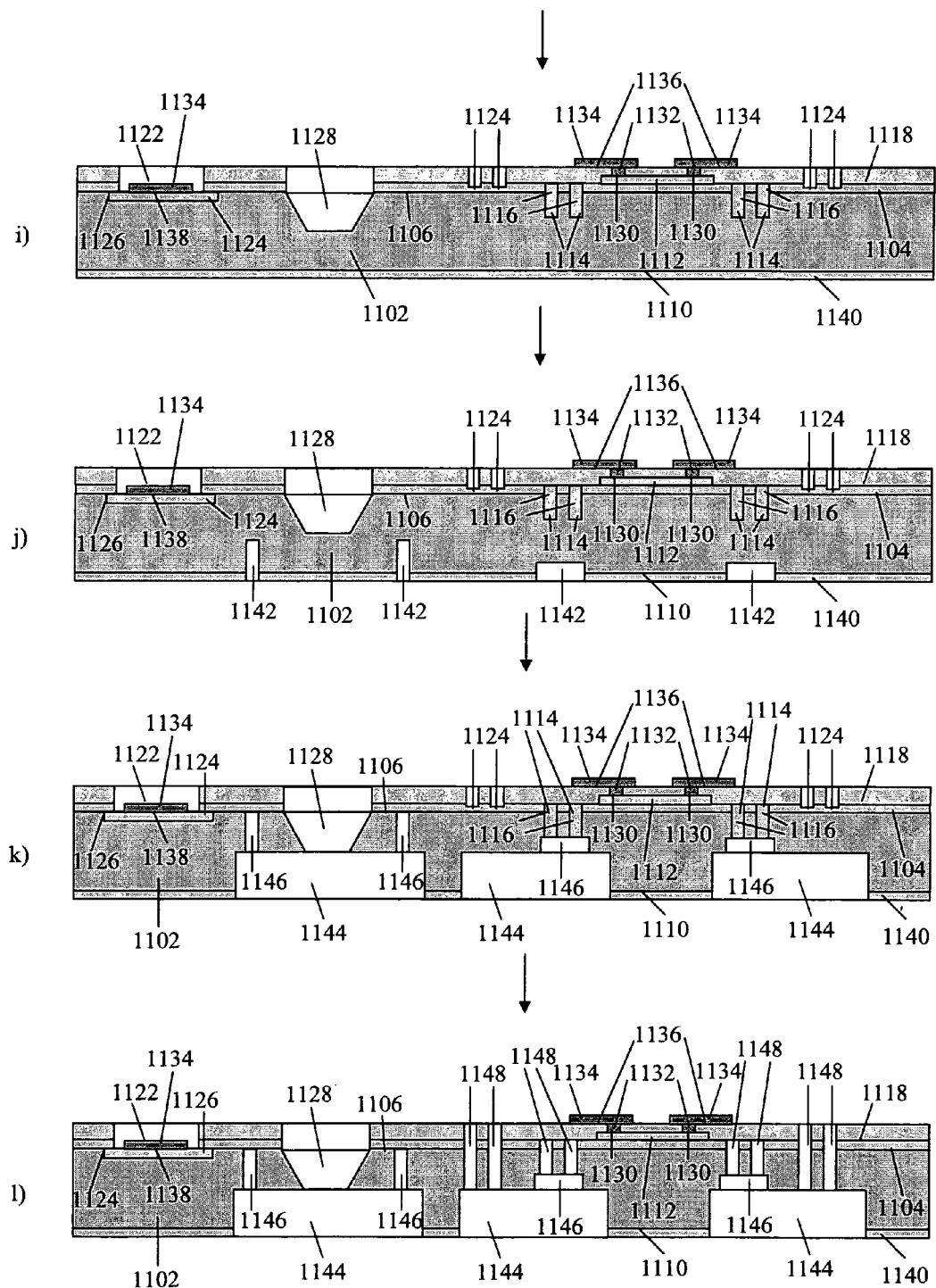

FIGS. 11a to 11l show a second exemplary process of forming the MEMS device 100. FIG. 11a shows a silicon wafer 1102. FIG. 11b shows a first layer 1104 of oxide deposited above a first surface 1106 of a silicon wafer 1102 and a second layer 1108 of oxide above a second surface 1110 of the silicon wafer 1102. The first layer 1104 of oxide and the second layer 1108 of oxide may be deposited respectively above the first surface 1106 and the second surface 1110 of the silicon wafer 1102 by low pressure chemical vapor deposition. FIG. 11c shows a layer 1112 of polysilicon above the first layer 1104 of oxide. The layer 1112 of polysilicon may be doped and patterned to expose the first layer 1104 of oxide.

FIG. 11d shows tooth structures 1114 formed in the first layer 1104 of oxide and the silicon wafer 1102. Oxide 1116 may be deposited in the tooth structures 1114. A third layer 1118 of oxide above the layer 1112 of polysilicon and the exposed first layer 1104 of oxide. FIG. 11e shows the third layer 1118 of oxide and the first layer 1104 of oxide patterned to expose parts 1120 of the silicon wafer 1102. FIG. 11f shows a cavity 1122 etched in the third layer 1118 of oxide, the first layer 1104 of oxide and the silicon wafer 1102. A fourth layer 1124 of oxide may be deposited in a portion 1126 of the cavity 1122 in the silicon wafer 1102 and may be deposited over the exposed parts 1120 of the silicon wafer 1102.

FIG. 11g shows a groove 1128 patterned and etched in the third layer 1118 of oxide, the first layer 1104 of oxide and the silicon wafer 1102. The groove 1128 may be etched in Tetra-Methyl-Ammonium Hydroxide. FIG. 11h shows that the third layer 1118 of oxide above the layer 1112 of polysilicon is etched. Metal 1130 may be deposited in the etched areas 1132 in the third layer 1118 of oxide. A layer 1134 of metal may be deposited and patterned such that portions 1136 of the third layer 1118 of oxide and a portion 1138 of the fourth layer 1124 of oxide are covered by the layer 1134 of metal. FIG. 11i shows a wafer thinning performed on the second surface 1110 of the silicon wafer 1102. The second layer 1108 of oxide is removed. A fifth layer 1140 of oxide may be deposited above the second surface 1110 of the silicon wafer 1102.

FIG. 11j shows a first trench etching performed in the fifth layer 1140 of oxide and the silicon wafer 1102. Cavities 1142 may be formed in the fifth layer 1140 of oxide and the silicon wafer 1102. FIG. 11k shows a second trench etching performed in the fifth layer 1140 of oxide and the silicon wafer 1102. Trenches 1144 may be formed in the fifth layer 1140 of oxide and the silicon wafer 1102. Cavities 1146 may be formed in the silicon wafer 1102. FIG. 11l shows a deep reactive ion etching performed above the first surface 1106 of the silicon wafer 1102. Cavities 1148 may be formed through the fourth layer 1124 of oxide and the silicon wafer 1102 to the trenches 1144 and may be formed through the oxide 1116 in the tooth structures 1114 to the cavities 1146. An oxide strip may be performed.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A microelectromechanical system (MEMS) device, comprising:
    a positioning mechanism comprising:
        a first arm structure having a first surface and a second surface;
        a second arm structure having a first surface and a second surface;
        wherein the first surface of the first arm structure faces the first surface of the second arm structure;
        a first actuator disposed adjacent to the second surface of the first arm structure facing away from the second arm structure; and
        a second actuator disposed adjacent to the second surface of the second arm structure facing away from the first arm structure;
    a locking mechanism, comprising:
        a first pair of locking elements arranged such that each locking element is disposed at two opposite side surfaces of the first arm structure between the first and second surfaces of the first arm structure; and
        a second pair of locking elements arranged such that each locking element is disposed at two opposite side surfaces of the second arm structure between the first and second surfaces of the second arm structure;
        wherein the first and second pairs of locking elements are configured to engage with and disengage from the first and second arm structures respectively.

2. The MEMS device of claim 1, further comprising a holding mechanism, the holding mechanism comprising a first wedge structure disposed at the first surface of the first arm structure and a second wedge structure disposed at the first surface of the second arm structure.

3. The MEMS device of claim 2, wherein a sloping surface of the first wedge structure faces a sloping surface of the second wedge structure.

4. The MEMS device of claim 3, wherein the sloping surface of the first wedge structure and the sloping surface of the second wedge structure are configured to hold an optical component.

5. The MEMS device of claim 4, wherein if the optical component comprises a lens, the MEMS device further comprises a waveguide.

6. The MEMS device of claim 4, wherein if the optical component comprises a fibre, the MEMS device further comprises a groove configured to hold the fibre.

7. The MEMS device of claim 1,
    wherein the first arm structure comprises a plurality of protruding portions disposed along a portion or a whole of the two side surfaces of the first arm structure facing the first pair of locking elements;
    wherein each protruding portion is spaced apart from an adjacent protruding portion by a cavity.

8. The MEMS device of claim 7,
    wherein each protruding portion of the first arm structure comprises a plurality of tooth structures;
    wherein each tooth structure is spaced apart from an adjacent tooth structure by a cavity.

9. The MEMS device of claim 7,
    wherein the first pair of locking elements comprises a plurality of protruding portions;
    wherein each protruding portion is spaced apart from an adjacent protruding portion by a cavity.

10. The MEMS device of claim 9,
    wherein each protruding portion of the first pair of locking elements comprises a plurality of tooth structures;
    wherein each tooth structure is spaced apart from an adjacent tooth structure by a cavity.

11. The MEMS device of claim 9,
    wherein the second arm structure comprises a plurality of protruding portions disposed along a portion or a whole of the two side surfaces of the second arm structure facing the second pair of locking elements;
    wherein each protruding portion is spaced apart from an adjacent protruding portion by a cavity.

12. The MEMS device of claim 11,
    wherein each protruding portion of the second arm structure comprises a plurality of tooth structures;
    wherein each tooth structure is spaced apart from an adjacent tooth structure by a cavity.

13. The MEMS device of claim 11,
    wherein the second pair of locking elements comprises a plurality of protruding portions;
    wherein each protruding portion is spaced apart from an adjacent protruding portion by a cavity.

14. The MEMS device of claim 13,
    wherein each protruding portion of the second pair of locking elements comprises a plurality of tooth structures;
    wherein each tooth structure is spaced apart from an adjacent tooth structure by a cavity.

15. The MEMS device of claim 13,
    wherein in an initial stage, the plurality of protruding portions of the first pair of locking elements are received in the respective cavities of the first arm structure and the plurality of protruding portions of the second pair of locking elements are received in the respective cavities of the second arm structure such that the first and second pairs of locking elements are engaged with the first and second arm structures respectively.

16. The MEMS device of claim 15,
    wherein when a power is supplied to the first and second pairs of locking elements, the first and second pairs of locking elements are adapted to disengage and move away from the first and second arm structures respectively.

17. The MEMS device of claim 16,
    wherein when a power is supplied to the first and second actuators, the first and second actuators are adapted to move towards or away from the first and second arm structures respectively to move the first and second arm structures.

18. The MEMS device of claim 17,
    wherein when the power supplied to the first and second pairs of locking elements is switched off, the first and second pairs of locking elements are adapted to move towards the first and second arm structures respectively such that the plurality of teeth structures of the first and second pairs of locking elements interlock with the plurality of teeth structures of the first and second arm structures respectively.

* * * * *